United States Patent [19]

Müller

[11] 4,183,036
[45] Jan. 8, 1980

[54] SCHOTTKY-TRANSISTOR-LOGIC

[75] Inventor: Rüdiger Müller, Munich, Fed. Rep. of Germany

[73] Assignee: Siemens Aktiengesellschaft, Berlin & Munich, Fed. Rep. of Germany

[21] Appl. No.: 798,798

[22] Filed: May 20, 1977

[30] Foreign Application Priority Data

May 31, 1976 [DE] Fed. Rep. of Germany ....... 2624339
May 31, 1976 [DE] Fed. Rep. of Germany ....... 2624409

[51] Int. Cl.$^2$ .................... H01L 27/04; H03K 19/08
[52] U.S. Cl. .................................. 357/44; 357/15; 357/46; 357/50; 357/91; 357/92; 148/1.5
[58] Field of Search ................ 357/15, 44, 46, 92; 307/213

[56] References Cited
U.S. PATENT DOCUMENTS

| | | | |
|---|---|---|---|
| 3,823,353 | 7/1974 | Berger et al. | 357/92 |
| 3,909,807 | 9/1975 | Fulton | 357/92 |
| 3,922,565 | 11/1975 | Berger et al. | 357/92 |
| 3,961,351 | 6/1976 | Blatt | 357/92 |
| 3,987,310 | 10/1976 | Peltier et al. | 357/92 |
| 4,035,664 | 7/1977 | Berger et al. | 357/92 |
| 4,053,925 | 10/1977 | Burr et al. | 357/91 |

OTHER PUBLICATIONS

Berger et al., "Schottky Transistor Logic", IEEE ISSCC, Digest of Technical Papers, pp. 172-173 (Feb. 1975).
Blatt et al., IEEE IEDM, Technical Digest, (Dec. 1974), pp. 511-514.

Primary Examiner—William D. Larkins
Attorney, Agent, or Firm—Hill, Van Santen, Steadman, Chiara & Simpson

[57] ABSTRACT

A Schottky-transistor-logic arrangement is disclosed which comprises a highly doped semiconductor substrate of one conductivity type. An epitaxial layer of the same conductivity type is formed on the substrate. A deep-implanted doped zone of the other conductivity type is located in the epitaxial layer in a plane spaced below the outer surface of said epitaxial layer and lying substantially parallel thereto. A load transistor and an output transistor are formed by constructing the arrangement so that the buried layer provides the base of the load transistor and the emitter of the output transistor. The emitter of the load transistor is provided by a portion of the epitaxial layer which lies below the deep-implanted doped zone. The collector of the load transistor and the base of the output transistor are provided by the portion of the epitaxial layer which lies above the deep-implanted zone. A Schottky electrode on the outer surface of the epitaxial layer provides the collector of the output transistor. A plurality of Schottky diodes are also formed in a portion of the epitaxial layer which possess a lower Schottky barrier than the Schottky electrode of the output transistor.

3 Claims, 6 Drawing Figures

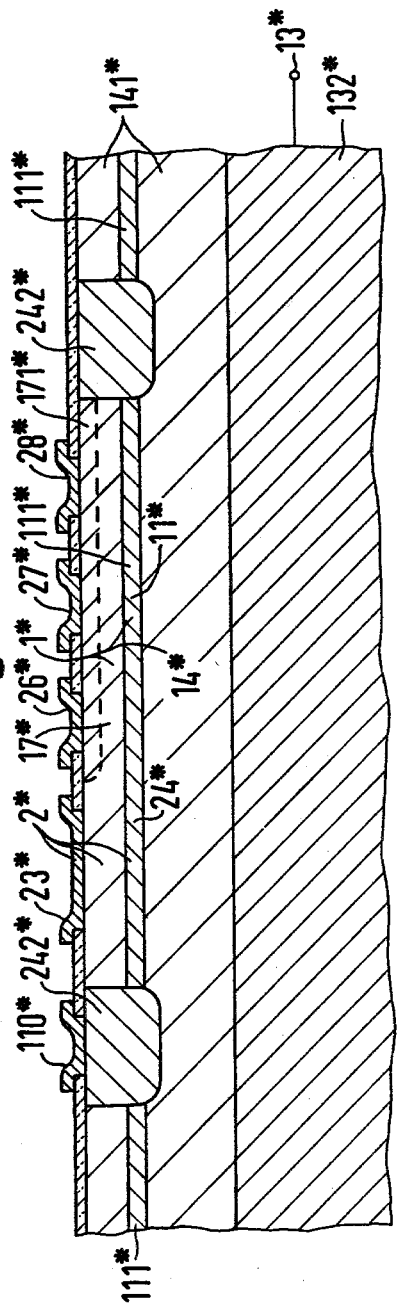
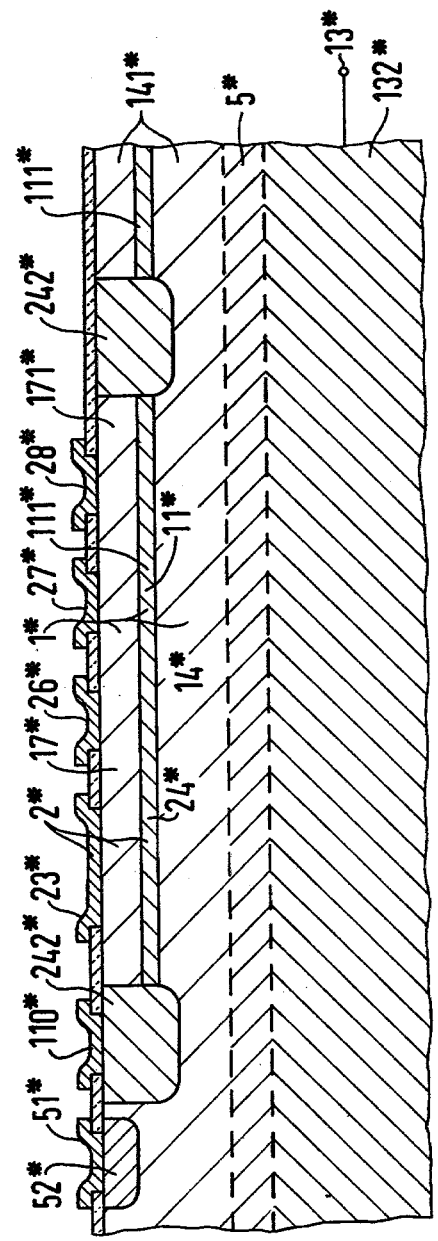

SCHOTTKY-TRANSISTOR-LOGIC

INTRODUCTION

The invention relates to a Schottky-transistor-logic. Circuits of this type are known. For example, the publication by H. H. Berger and S. K. Wiedmann, "Schottky Transistor Logic", ISSCC, Philadelphia, Feb. 1975, describes a logic arrangement of this kind, in which the minimum switching time of this I²L (Integrated Injection Logic) gate arrangement is fundamentally determined by the minority carrier storage in the base and in the emitter of the output transistor. It has been attempted to reduce the minority carrier storage by introducing Schottky-contacts. However, with feed through the substrate, this proposal necessitates two epitaxial layers, where the thickness of the epitaxial layers determines the base width of the load- and output- transistor. An oxide-insulation-technique is required for the mutual insulation of the components.

BRIEF SUMMARY OF THE INVENTION

It is an object of the present invention to provide a novel Schottky-transistor-logic-arrangement with which gate transit times of around 1 ns can be achieved.

It is a further object of this invention to provide a novel improved Schottky-transistor-logic arrangement which has a load transistor and an output transistor comprising a relatively highly doped semiconductor substrate of one conductivity type, an epitaxial layer of said one conductivity type on said substrate, a buried layer of the other conductivity type spaced below the outer surface of said epitaxial layer and in a plane substantially parallel to said outer surface and above the inner surface of said epitaxial layer, a sub-zone of said epitaxial layer being both the base zone of said load transistor and the emitter zone of said output transistor, a zone of said epitaxial layer located beneath said buried layer being the emitter zone of said load transistor, a zone of said epitaxial layer located above said buried layer being the collector zone of said load transistor, as well as the base zone of said output transistor, the outer surface of said epitaxial layer having a metal electrode forming a Schottky-junction with said epitaxial layer and forming the collector terminal of said output transistor.

Advantageously, the base width of the transistors employed can be reduced, by ion implantation, to widths of below one μm.

Further details of the invention are given in the description and the Figures.

BRIEF DESCRIPTION OF THE DRAWINGS

FIGS. 4 to 6 schematically illustrate cross-sections through further embodiments of the present invention.

DESCRIPTION OF THE PREFERRED EMBODIMENTS

Figure 1:
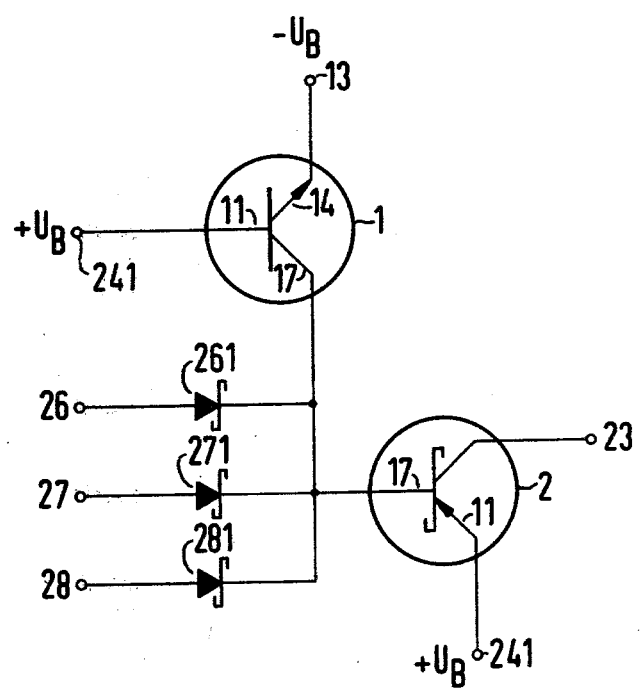
FIG. 1 is the circuit diagram of a Schottky-transistor-logic arrangement which is the type of circuit arrangement found in a semiconductor component incorporating this invention.
Figure 3:
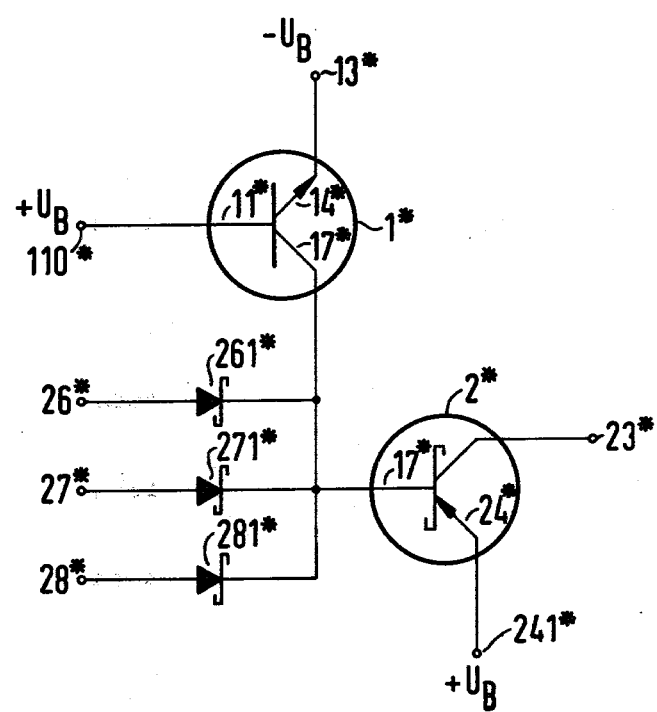
FIG. 3 is the circuit diagram of a Schottky-transistor-logic arrangement which is the type of circuit arrangement found in a semiconductor component incorporating this invention.

The present invention relates to a novel semiconductor component which is formed in such a way as to provide a Schottky-transistor logic circuit arrangement as shown in FIGS. 1 and 3 of the drawings. The electrical circuit per se is known. Before considering the structure of the semiconductor component a brief explanation will be made of the circuit diagram of a known Schottky-transistor-logic in which the logic consists of a load transistor 1 and an output transistor 2. The collector 17 of the load transistor 1, which is controlled via its base 11, is connected to the base of the output transistor 2, whose collector 23 represents the output. Via diodes 261, 271 and 281, the inputs 26, 27 and 28 are connected to the collector 17 of the transistor 1 and to the base zone 17 of the transistor 2. For example, the transistor 1 is an npn-transistor, and the transistor 2 is a pnm-transistor. Here a pnm-transistor is to be understood as a transistor whose collector is formed by a metal layer applied to a semiconductor zone, which metal layer forms a Schottky-junction with the semiconductor zone. The base terminal 241 of the load transistor 1 and the emitter terminal 241 of the output transistor 2 are preferably connected to a voltage $+U_D$. Preferably, a voltage $-U_B$ is connected to the emitter terminal 13.

Figure 2:
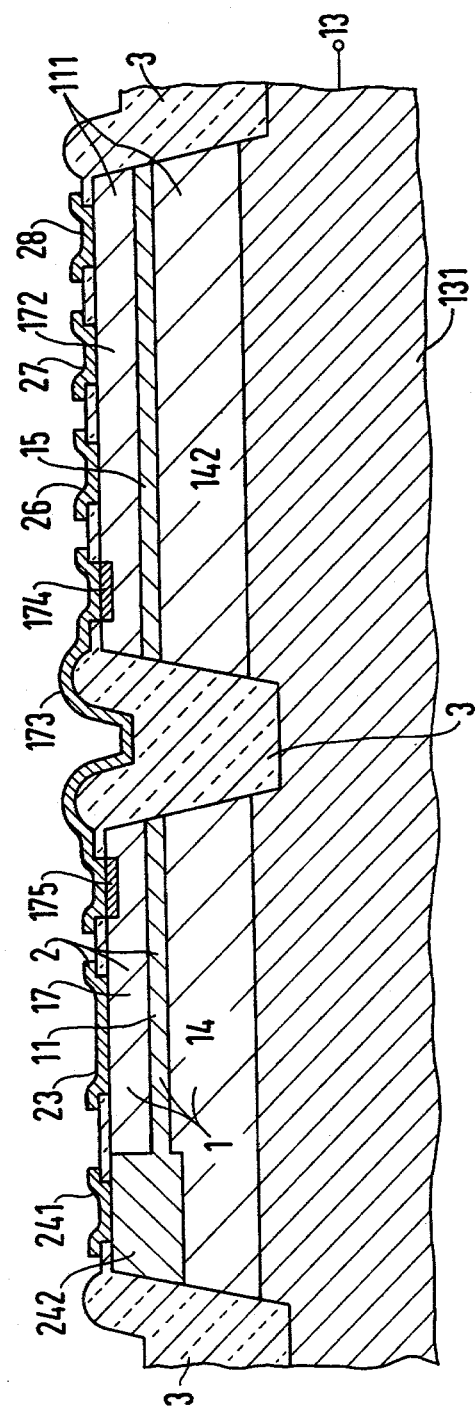
FIG. 2 schematically illustrates a semiconductor component which embodies the present invention and which results in a circuit such as that shown in FIG. 1.

FIG. 2 illustrates an embodiment of the arrangement corresponding to the invention, in which npn-load transistors 1, and pnm-output transistors 2 are separated by oxide insulations 3 from the input diodes 26, 27, 28. An npn-transistor 1 and a pnm-output transistor 2 are produced in that an epitaxially deposited n-doped layer 111 is applied to an n+-doped substrate 131, which is preferably a silicon substrate. The substrate 131, which is provided with an emitter terminal contact 13, represents the emitter terminal zone of the npn-load transistor 1. The zone 14, illustrated in FIG. 2, of the layer 111 represents the emitter zone of the npn-load transistor 1. In the epitaxially deposited n-doped layer 111, separating zones 3 electrically insulate individual zones for the production of the transistors 1 and 2 from other zones for the production of the Schottky diodes 26, 27, 29. The separating insulators are preferably silicon dioxide layers which have been introduced into previously applied etchings. Above the emitter zone 14 of the npn-load transistor 1 there is arranged a p-deep-implanted zone 11. This zone 11 represents the base zone of the load transistor 1. The electrodes 26, 27, 28 are arranged on that part 172 of the epitaxial layer 141 which lies above the deep-implanted p-zone 15. These electrodes serve as input electrodes of the overall arrangement, and form Schottky-junctions with the zone 172. Via an n+-doped zone 174, which is arranged on the surface of the zone 172, and a conductor path 173, the zone 172 is connected to the base zone 17 of the pnm-output transistor 2. The n-doped zone 175, which represents the base zone of the output transistor, lies above the deep-implanted zone 11. The deep-implanted zone 11, which was produced in the same process step as the zone 15, represents the emitter zone of the output transistor 2, and at the same time the base zone of the load transistor 1. In the manner shown in the Figure, the deep-implanted zone 11 is connected to a likewise p-doped diffusion zone 242, and to an electrode 241 which is arranged above the latter, and which represents the emitter terminal of the output transistor 2. On the zone 17 is arranged the electrode 23, which forms a Schottky-contact with the zone 17, and which represents the output of the arrangement. The materials of the electrodes 23, 26, 27 and 28 are selected to be such that the electrodes 26, 27 and 28 possess a lower Schottky-barrier than the output electrode 23. For this purpose, the output electrode 23 preferably consists PtSi and the electrodes 26, 27, and 28 consist of Ti. The level difference between a logic "zero" and a logic "one" then corresponds approximately to the difference in the Schottky-barrier level.

A gate arrangement possessing pnp-load transistors and npm-output transistors is produced in that the zones described in FIG. 2 are in each case doped in the opposite manner. The electrodes are connected to the voltages, shown in FIG. 1, of opposite polarity. PtSi is a suitable material for the electrode 23, and Ti is a suitable material for the electrodes 26, 27 and 29.

In the arrangement corresponding to FIG. 2, the n+ -substrate 131 can in each case be replaced by a p-substrate. In the arrangement shown in FIG. 2, the deep-implanted layer 15 can then be dispensed with and replaced by a buried n+ layer beneath the deep-implanted layer 11. In this case, the buried n+ -layer must be connected to the voltage -$U_B$, however, so that the deep-implantation may no longer be able to be carried out over the entire surface.

FIGS. 3 to 6 illustrate further, preferred embodiments of the invention.

An essential advantage of these embodiments consists in that they can be produced with a minimum of process steps. In this case, a 4-mask process is possible on the basis of an n+ - (p+) -substrate, and an n(p) -eptaxial layer.

FIG. 3 is the circuit diagram of the known Schottky-transistor logic, where this logic consists of the load transistor 1* and the output transistor 2*. The collector of the load transistor 1* which is controlled via its base 11*, is connected to the base of the output transistor 2* whose collector 23* represents the output. Via diodes 261*, 271* and 281*, the inputs 26*, 27* and 28* are connected to the collector of the transistor 1* and to the base zone 17* of the transistor 2*. For example, the transistor 1* is in the form of an npn-transistor, and the transistor 2* is in the form of a pnm-transistor. Here a pnm-transistor is to be understood as a transistor whose collector is formed by a metal layer applied to a semiconductor zone, where said metal layer forms a Schottky-junction with the semiconductor zone. The base terminal 110* of the load transistor 1* and the emitter terminal 241* of the output transistor 2* are preferably connected to a voltage +$U_B$. Preferably a voltage -$U_B$ is connected to the emitter terminal 13*.

Details of FIG. 4 which have already been described in association with FIG. 3 are referenced correspondingly. For the construction of an npn-load transistor 1*, and a pnm-output transistor 2*, and n+-doped substrate 132*, preferably a silicon substrate, is provided which represents the emitter-terminal zone of the npn-load transistor 1*. The substrate 132* is provided with the emitter terminal contact 13*. The n-doped silicon layer 141* is epitaxially deposited on the n+-doped silicon substrate 132*. For example, the thickness of this approximately 0.3 to 1 Ω· cm-layer 141* amounts to approximately 1 to 5 μm. The zone 14* of the layer 141* represents the emitter zone of the npn-load transistor 1*. A deep-implanted p-layer 111* is provided in the manner shown in FIG. 2 in the n-epitaxial layer 141*. The said deep-implanted layer is located approximately 0.7 to 1 μm beneath the surface of the silicon layer 141* and the zones 11* and 24* represent the base zone of the npn-load transistor 1* and the emitter zone of the output transistor 2*. Preferably the deep-implantation of the layer 111* is carried out over the whole surface. The doping of the layer 111* exceeds that of the silicon layer 141*, for example, approximately by the factor 30. The production of the deep-implanted 111* is carried out, for example, with acceleration voltages from 300 to 600 kV.

That n-doped part 17* of the epitaxial layer 141*, which is located above the zones 11* and 24* of the layer 111*, simultaneously represents the n-base zone of the output transistor 2*, and the n-collector zone of the npn-load transistor 1*. Arranged on the zone 17* are the electrode 23*, which represents the collector-terminal of the pnm-output transistor 2*, and electrodes 26*, 27* and 28* which represents the input electrodes. Here the electrode 23* forms a Schottky-junction with the layer 17*. The electrodes 26*, 27* and 28* likewise form Schottky-junction with the layer 17*. The materials of the electrodes 23*, 26*, 27* and 28* are selected to be such that the Schottky-barriers of the electrodes 26*, 27* and 28* are smaller than the Schottky-barriers of the output collector 23*. The electrode 23* is, for example, an electrode consisting of PtSi, and the electrodes 26*, 27* and 28* are electrodes consisting of Ti. The level difference between the logic "zero" and a logic "one" corresponds approximately to the difference in the Schottky-barrier height.

The two diffusion zones 242* serve as separating diffusions, and separate the described arrangement comprising the load transistor 1* and the output transistor 2* from other arrangements. One of these diffusion zones 242* is provided with an electrode 110*, which represents the terminal electrode for the emitter zone 24* of the output transistor 2* and for the base zone 11* of the load transistor 1*. In order to prevent the electrodes 26*, 27* and 28* and the input diodes 261*, 271*, 281* acting as Schottky-collector, an intermediate layer 171*, can be provided beneath the electrodes 26*, 27* and 28*, which prevents or reduces the injection of holes out of the deep-implanted p-layer 111*, or reduces the lifetime of the holes. Here the intermediate layer 171* can either be provided with an n-doping material having a doping concentration which reduces towards the surface, or can be produced by bombardment with ions which reduce the conductivity, for example, nitrogen ions. Layers of this type can be produced by ion implantation employing energies of more than 100 keV.

When the arrangement corresponding to the invention is designed as shown in FIG. 5, the n+-doped substrate 132* is replaced by a p-doped substrate 132*. An additional n+-layer (buried layer) 5* assumes the function of the n+-substrate 132* of the arrangement shown in FIG. 4. The additional n+-layer 5* is connected via the epitaxial layer 141* and via an n+-diffused zone 52* which is provided with a terminal electrode 51*.

Figure 6:
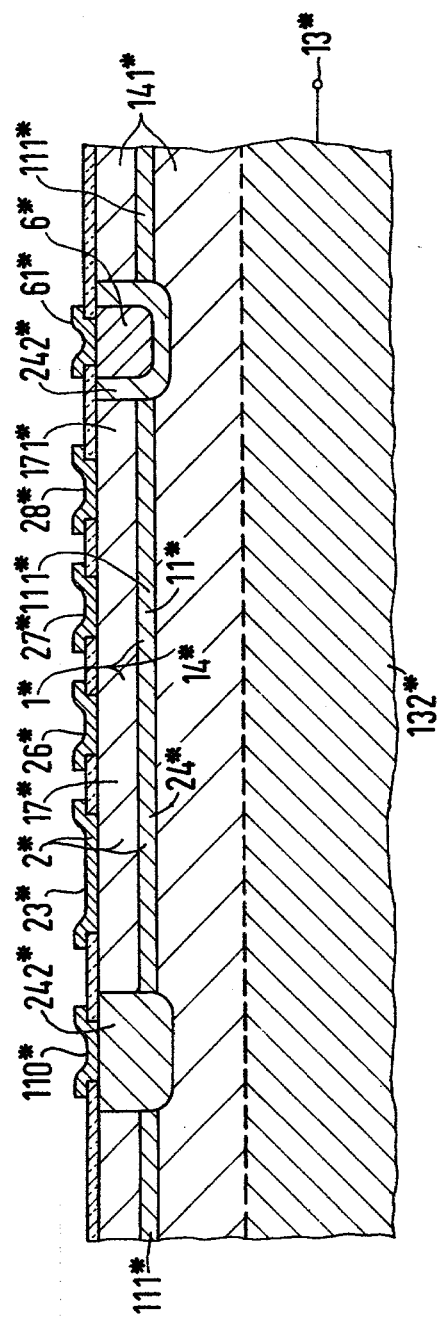

Details of FIG. 5 which have already been described in association with FIG. 4 bear the corresponding references. In a further development of the invention with a p-doped substrate 132* as shown in FIG. 6, the injection across the substrate is carried out by injection via an n+-doped zone 6* which is assigned to the p-diffused zone 242* in the manner illustrated in FIG. 5. Details of FIG. 6 which have already been described in association with FIG. 4 are referenced accordingly.

In order to produce a gate arrangement comprising pnp-load transistors and npm-output transistors, the zones described in FIGS. 4 to 6 are each doped in the opposite manner. The electrodes are connected to the voltages shown in FIG. 1, of the opposite polarity. Ti and PtSi are likewise suitable materials for the electrode 23* and the electrodes 26*, 27* and 28*.

It will be apparent to those skilled in the art that many modifications and variations may be effected without departing from the spirit and scope of the novel concepts of the present invention.

I claim as my invention:

1. Schottky-transistor-logic comprising a highly doped semiconductor substrate of one conductivity type, an epitaxial layer of said one conductivity type on said substrate, a buried layer of the other conductivity type in said epitaxial layer spaced below the outer surface of said epitaxial layer in a plane substantially parallel to said outer surface, an insulating wall extending through said epitaxial layer and into said substrate thereby dividing said epitaxial layer into two zones, a collector and an emitter being provided in one of said zones by portions of said epitaxial layer above and below said buried layer, and a base being provided by said buried layer between said collector and said emitter, a Schottky-transistor being provided in said one zone by a Schottky electrode on the surface of said epitaxial layer, a portion of said epitaxial layer and a portion of said buried layer therebetween, a plurality of additional Schottky electrodes on the surface of said other zone of said epitaxial layer, said plurality of additional Schottky electrodes possessing a lower Schottky-barrier than the output Schottky electrode of said output transistor, and an external contact connecting the two portions of said epitaxial layer lying above said buried layer.

2. Schottky-transistor-logic comprising a highly doped semiconductor substrate of one conductivity type, an epitaxial layer of said one conductivity type on said substrate, a buried layer of the other conductivity type in said epitaxial layer spaced below the outer surface of said epitaxial layer in a plane substantially parallel to said outer surface, an insulating wall extending through said epitaxial layer and into said substrate thereby dividing said epitaxial layer into a first zone and a second zone, a load transistor and an output transistor each having a base, a collector and an emitter, the base of said load transistor being provided by the buried layer of said first zone, the collector of said load transistor being provided by the portion of said epitaxial layer of said first zone lying above said buried layer, and the emitter of said load transistor being provided by the portion of said epitaxial layer in said first zone lying below said buried layer, the base of said output transistor being provided by the portion of said epitaxial layer first zone lying above said buried layer, the emitter of said output transistor being provided by said buried layer of said first zone, and the collector of said output transistor being provided by a Schottky electrode on the surface of said epitaxial layer of said first zone, a plurality of additional Schottky electrodes on the surface of said second zone of said epitaxial layer, said plurality of additional Schottky electrodes possessing a lower Schottky-barrier than the output Schottky electrode of said output transistor, and an external contact connecting the two portions of said epitaxial layer lying above said buried layer.

3. Schottky-transistor-logic according to claim 2, in which said insulating wall is formed of SiO$_2$.

* * * * *